(12) United States Patent
Chung et al.

(10) Patent No.: US 11,705,418 B2
(45) Date of Patent: Jul. 18, 2023

(54) SEMICONDUCTOR PACKAGE WITH CONDUCTIVE BUMP ON CONDUCTIVE POST INCLUDING AN INTERMETALLIC COMPOUND LAYER

(71) Applicant: Samsung Electronics Co., Ltd., Suwon-si (KR)

(72) Inventors: Hyunsoo Chung, Hwaseong-si (KR); Taewon Yoo, Seoul (KR); Myungkee Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 17/018,259

(22) Filed: Sep. 11, 2020

(65) Prior Publication Data

US 2021/0202423 A1 Jul. 1, 2021

(30) Foreign Application Priority Data

Dec. 27, 2019 (KR) .......................... 10-2019-0176181

(51) Int. Cl.
*H01L 25/065* (2023.01)
*H01L 25/00* (2006.01)
(Continued)

(52) U.S. Cl.
CPC .............. *H01L 24/14* (2013.01); *H01L 23/31* (2013.01); *H01L 23/53238* (2013.01); *H01L 23/562* (2013.01)

(58) Field of Classification Search
CPC ....... H01L 2224/0401; H01L 24/10–17; H01L 24/11; H01L 24/03; H01L 24/13;
(Continued)

(56) References Cited

U.S. PATENT DOCUMENTS 5,059,677 A * 10/1991 Kohtoh .................... H01L 29/51
528/353
6,362,090 B1 3/2002 Paik et al.
(Continued)

FOREIGN PATENT DOCUMENTS

JP 6500683 B2 4/2019
KR 20150033115 A 4/2015

*Primary Examiner* — Marcos D. Pizarro
*Assistant Examiner* — Tenley H Schofield
(74) *Attorney, Agent, or Firm* — Harness, Dickey & Pierce, P.L.C.

(57) ABSTRACT

A semiconductor package includes a semiconductor chip including a contact pad on an active surface, a first insulating layer on the active surface including a first opening that exposes the contact pad, a redistribution layer connected to the contact pad and extending to an upper surface of the first insulating layer, a second insulating layer on the first insulating layer and including a second opening that exposes a contact region of the redistribution layer, a conductive post on the contact region, an encapsulation layer on the second insulating layer and surrounding the conductive post, and a conductive bump on an upper surface of the conductive post. The conductive post includes an intermetallic compound (IMC) layer in contact with the conductive bump. An upper surface of the IMC layer is lower than an upper surface of the encapsulation layer.

20 Claims, 14 Drawing Sheets

(51) Int. Cl.
*H01L 21/768* (2006.01)
*H01L 23/00* (2006.01)
*H01L 23/532* (2006.01)
*H01L 23/31* (2006.01)

(58) Field of Classification Search
CPC .......... H01L 2924/01074; H01L 24/81; H01L 2224/05655; H01L 2224/05672; H01L 2924/01079; H01L 2224/0345; H01L 2224/05666; H01L 2224/133
See application file for complete search history.

(56) References Cited

U.S. PATENT DOCUMENTS

| | | | |
|---|---|---|---|
| 8,735,276 B2 | 5/2014 | Chung et al. | |
| 9,793,219 B2 | 10/2017 | Shimizu | |
| 9,935,072 B2 | 4/2018 | Jeong et al. | |
| 2005/0275096 A1* | 12/2005 | Zeng | B23K 35/262 257/772 |
| 2006/0192298 A1* | 8/2006 | Bauer | H01L 24/05 257/E23.069 |
| 2007/0273025 A1* | 11/2007 | Bellaiche | H01L 24/11 257/737 |
| 2008/0296764 A1* | 12/2008 | Chang | H01L 24/13 257/738 |
| 2009/0130840 A1* | 5/2009 | Wang | H01L 24/05 257/E21.477 |
| 2010/0207271 A1* | 8/2010 | Omi | H01L 24/05 257/737 |
| 2011/0227219 A1* | 9/2011 | Alvarado | H01L 24/03 257/738 |
| 2013/0264684 A1 | 10/2013 | Yu et al. | |
| 2017/0148753 A1* | 5/2017 | Choi | H01L 24/11 |
| 2018/0138115 A1* | 5/2018 | Lu | H01L 21/6835 |
| 2018/0240768 A1* | 8/2018 | Paek | H01L 24/13 |
| 2019/0267350 A1* | 8/2019 | Tajima | H01L 24/14 |
| 2020/0381348 A1* | 12/2020 | Chang | H01L 23/49822 |

\* cited by examiner

SEMICONDUCTOR PACKAGE WITH CONDUCTIVE BUMP ON CONDUCTIVE POST INCLUDING AN INTERMETALLIC COMPOUND LAYER

CROSS-REFERENCE TO RELATED APPLICATION(S)

This application claims benefit of priority to Korean Patent Application No. 10-2019-0176181 filed on Dec. 27, 2019 in the Korean Intellectual Property Office, the disclosure of which is incorporated by reference herein in its entirety.

BACKGROUND

The present disclosure relates to a semiconductor package.

A semiconductor package may use surface mount technology (SMT) to mount on a main board (e.g., a printed circuit board). For example, conductive bumps, such as solder balls, formed in a semiconductor package in a surface-mounted manner may be disposed on connection pads of the main board, and joint portions such as solder joints connecting the semiconductor package and the mainboard may be formed by a reflow process.

Inconsistencies in a coefficient of thermal expansion (CTE) between the semiconductor chip (e.g., Si) and a constituent material (e.g., an organic material) of the main board can affect reliability because stress may be concentrated in a joint region and the joint region may be broken.

SUMMARY

An example embodiment of inventive concepts provides a semiconductor package capable of providing a joint portion (e.g., solder joint) having high reliability.

According to an example embodiment of inventive concepts, a semiconductor package includes: a semiconductor chip including an active surface and a contact pad on the active surface; a first insulating layer on the active surface, the first insulating layer including a first opening that exposes the contact pad; a redistribution layer connected to the contact pad, the redistribution layer extending to an upper surface of the first insulating layer; a second insulating layer on the first insulating layer, the second insulating layer including a second opening that exposes a contact region of the redistribution layer; a conductive post on the contact region, the conductive post including an intermetallic compound (IMC) layer; an encapsulation layer on the second insulating layer, the encapsulation layer surrounding the conductive post, an upper surface of the encapsulation layer being higher than an upper surface of the IMC layer; and a conductive bump on an upper surface of the conductive post, the conductive bump contacting the IMC layer.

According to an example embodiment of inventive concepts, a semiconductor package includes: a redistribution structure having a first surface and a second surface opposing each other, the redistribution structure including a redistribution layer; a semiconductor chip on the first surface of the redistribution structure, the semiconductor chip including an active surface and a contact pad, the active surface facing the first surface, the contact pad being on the active surface, the contact pad being connected to one region of the redistribution layer; an encapsulation layer on the second surface of the redistribution structure, the encapsulation layer including a through-hole in which an other region of the redistribution layer is exposed; and a conductive post filling the through-hole of the encapsulation layer, the conductive post connected to the other region of the redistribution layer, and the conductive post including an upper surface that is lower than an upper surface of the encapsulation layer.

According to an example embodiment of inventive concepts, a semiconductor package includes: a semiconductor chip, an insulating layer, an encapsulation layer, a conductive post, and a conductive bump. The semiconductor chip includes an active surface, a contact pad on the active surface, and a passivation film on the active surface. The passivation film includes a pad opening that exposes the contact pad. The insulating layer is on the passivation film and includes an opening that exposes a region of the contact pad. The encapsulation layer is on the insulating layer and includes a through-hole over the opening. The conductive post fills the through-hole and connects to the region of the contact pad through the opening. The conductive bump is on an upper surface of the conductive post. The conductive post includes an IMC layer in contact with the conductive bump. An upper surface of the IMC layer is lower than an upper surface of the encapsulation layer.

BRIEF DESCRIPTION OF DRAWINGS

The above and other aspects, features, and effects of inventive concepts will be more clearly understood from the following detailed description, taken in conjunction with the accompanying drawings, in which.

DETAILED DESCRIPTION

Hereinafter, example embodiments of inventive concepts will be described in detail with reference to the accompanying drawings.

Figure 1:
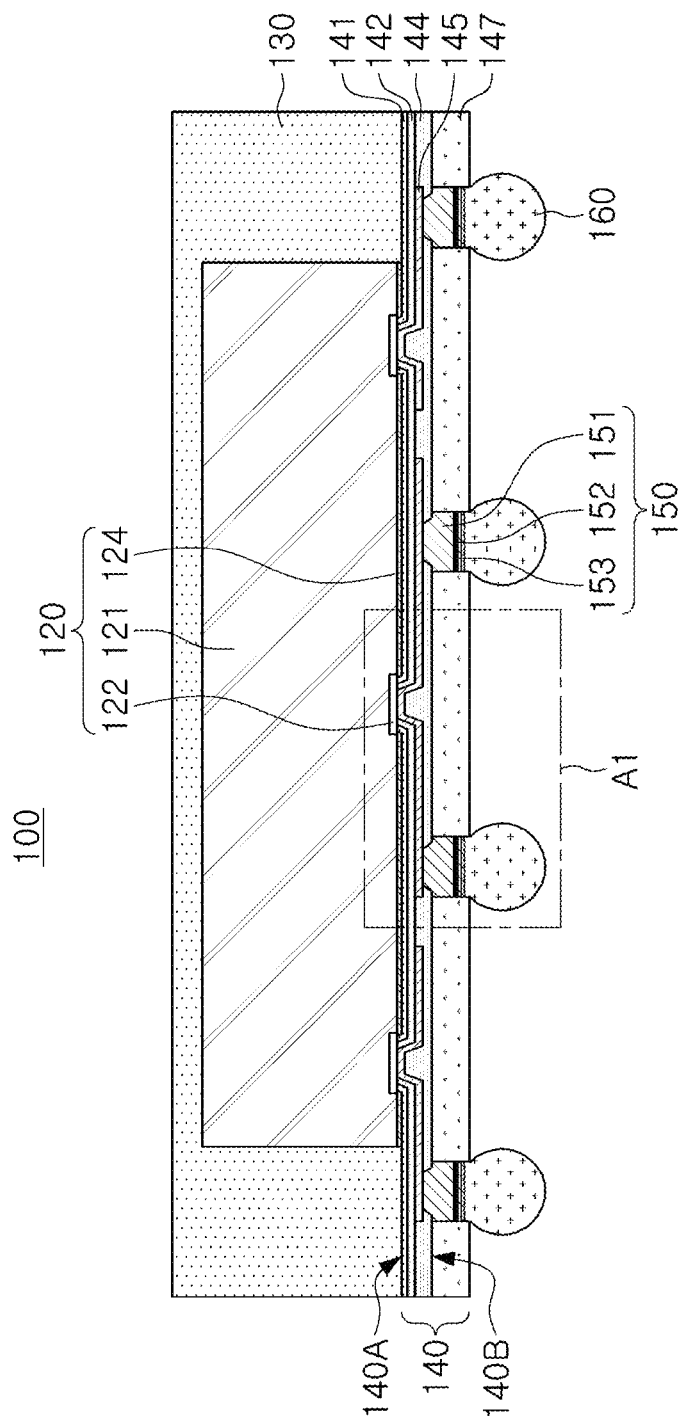
FIG. 1 is a side cross-sectional view illustrating a semiconductor package according to an example embodiment of inventive concepts.
Figure 2:
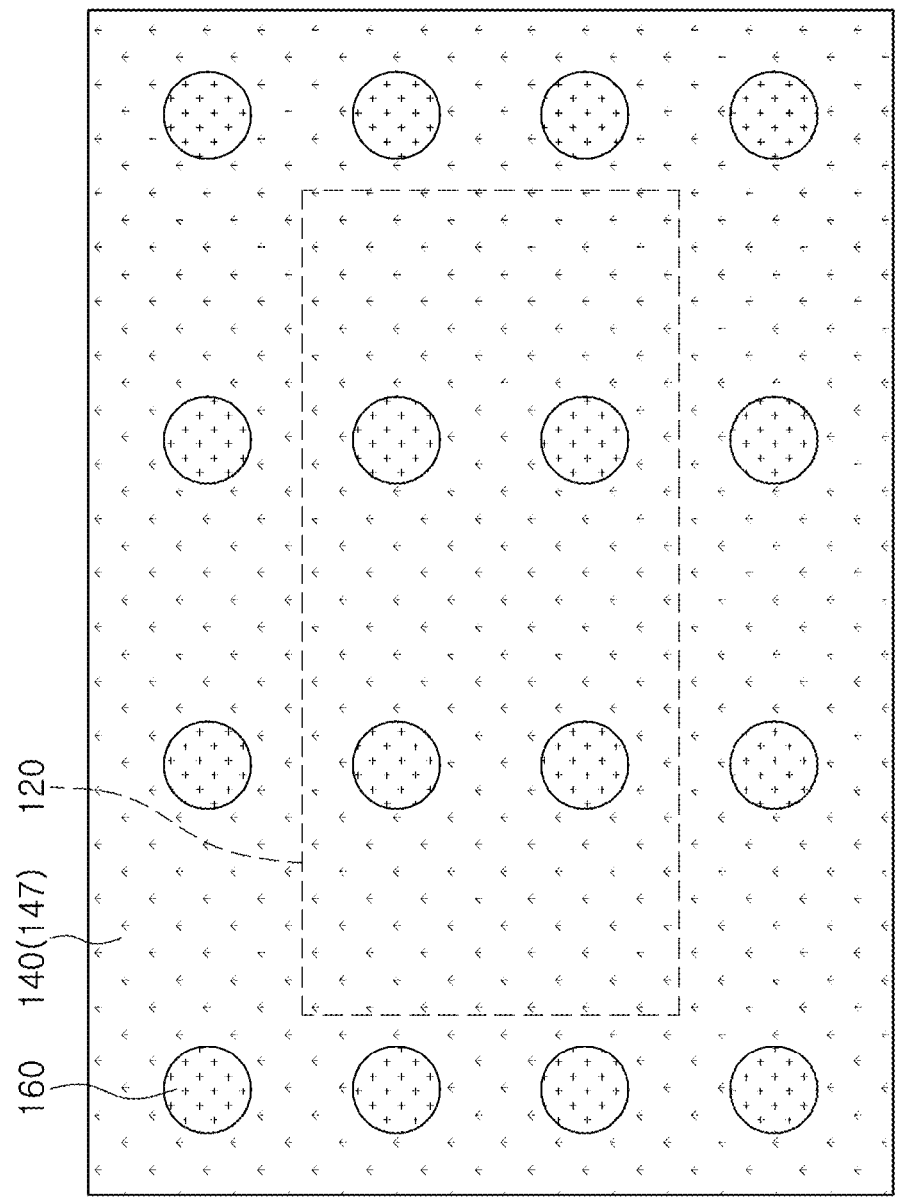
FIG. 2 is a lower plan view of the semiconductor package shown in FIG. 1.

FIG. 1 is a side cross-sectional view illustrating a semiconductor package according to an example embodiment, and FIG. 2 is a lower plan view of the semiconductor package shown in FIG. 1.

Referring to FIGS. 1 and 2, the semiconductor package 100 according to the present example embodiment includes a redistribution structure 140 having a first surface 140A and a second surface 140B disposed opposite to each other, and including a redistribution layer 145, and a semiconductor chip 120 disposed on the first surface 140A of the redistribution structure 140, and having an active surface facing the first surface 140A and having a contact pad 122 disposed thereon.

The semiconductor chip 120 is disposed such that the active surface thereof faces the first surface 140A of the redistribution structure 140, and the contact pad 122 can be connected to one region of the redistribution layer 145.

The semiconductor package 100 may further include a plurality of conductive posts 150 disposed in a plurality of contact regions ("CA" in FIG. 3) of the redistribution layer 145, an encapsulation layer 147 disposed on the second surface 140B of the redistribution structure 140, and surrounding the plurality of conductive posts 150, respectively, and a plurality of conductive bumps 160 connected to the plurality of conductive posts 150, respectively.

The plurality of conductive posts 150 has a recessed surface RS positioned lower than a surface 147S of the encapsulation layer 147. Accordingly, an interface between the plurality of conductive posts 150 and the conductive bumps 160 may be positioned lower than the surface 147S of the encapsulation layer 147. This will be described in detail with reference to FIG. 3.

In the present example embodiment, the semiconductor chip 120 is disposed on a portion of the first surface 140A of the redistribution structure 140, and the semiconductor package 100 may further include a molding portion 130 disposed on the first surface 140A of the redistribution structure 140, and surrounding the semiconductor chip 120.

Referring to FIGS. 1 and 2, a plurality of conductive bumps 160 and a plurality of conductive posts 150 employed in the present example embodiment may also be arranged not only in a "fan-in" region overlapped with the semiconductor chip 120, but also in a "fan-out" region not overlapped with the semiconductor chip 120.

Figure 3:
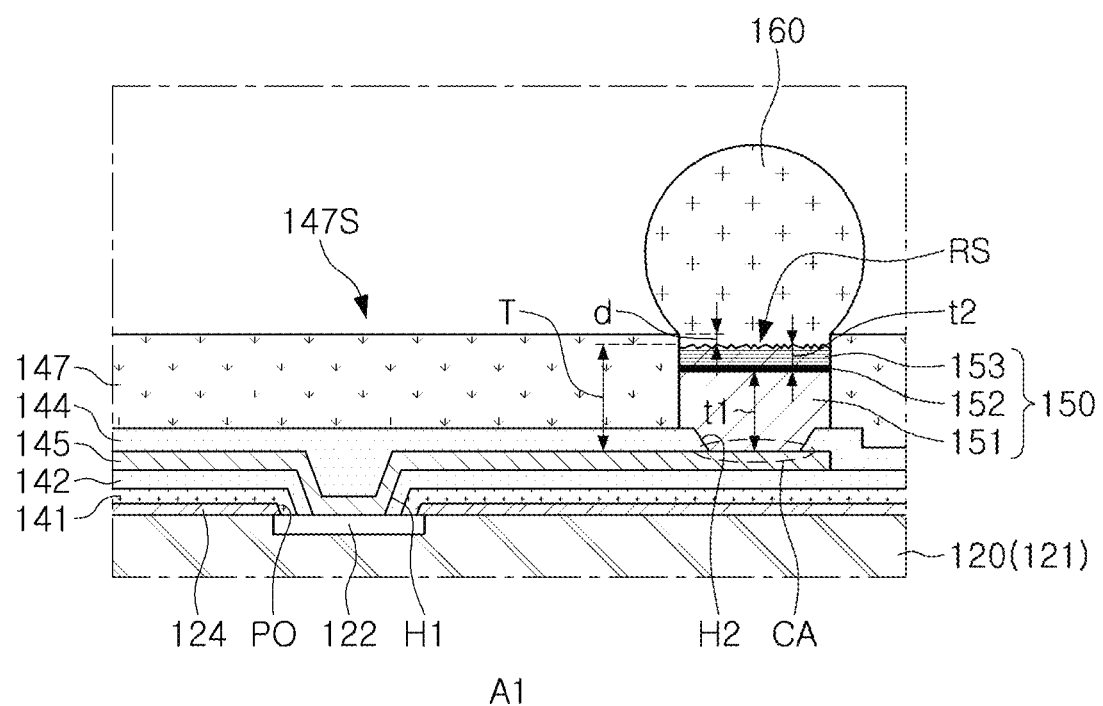
FIG. 3 is an enlarged view illustrating a region "A1" of the semiconductor package shown in FIG. 1.

FIG. 3 is an enlarged view illustrating a region "A1" of the semiconductor package shown in FIG. 1.

Referring to FIG. 3, the redistribution structure 140 may include a plurality of insulating layers 142 and 144 to implement the redistribution layer. Specifically, the redistribution structure 140 includes a first insulating layer 142 disposed on the active surface of the semiconductor chip 120 and having a first opening H1 for opening the contact pad 122, a redistribution layer 145 connected to the contact pad 122 and extending to an upper surface of the first insulating layer 142, and a second insulating layer 144 disposed on the first insulating layer 142 and having a second opening H2 for opening the contact region CA of the redistribution layer 145.

The first and second insulating layers 142 and 144 may include various insulating materials. For example, the first and second insulating layers 142 and 144 may include a thermosetting resin such as an epoxy resin or a thermoplastic resin such as polyimide. In some example embodiments, the first and second insulating layers 142 and 144 may include a photoimagable dielectric (PID) material.

The semiconductor chip 120 includes a semiconductor substrate 121 having an active surface and an inactive surface, opposite to the active surface. A plurality of active/passive elements (e.g., transistors) and a contact pad 122 connected thereto may be disposed on the active surface of the semiconductor substrate 121. For example, the semiconductor substrate 121 may include silicon. In other examples, the semiconductor substrate 121 may include a semiconductor element such as germanium, or a compound semiconductor such as silicon carbide (SiC), gallium arsenide (GaAs), indium arsenide (InAs), and indium phosphide (InP). A passivation film 124 may include a pad opening PO exposing the contact pad 122. The passivation film 124 may be disposed on the active surface of the semiconductor substrate 121. For example, the passivation film 124 may be a silicon oxide film or a silicon nitride film.

The semiconductor chip 120 employed in the present example embodiment may include a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, and the like, specifically, an application processor (AP), but an example embodiment thereof is not limited thereto. The semiconductor chip 120 may include a memory chip such as a volatile memory (e.g., a DRAM), a non-volatile memory (e.g., a ROM), a flash memory, or the like, or a logic chip such as an analog-digital converter, an application-specific IC (ASIC), and the like, or a power management IC (PMIC).

The redistribution structure 140 may include an insulating resin layer disposed on the passivation film 124. In the present example embodiment, it is possible to ensure firm join between the passivation film 124 and the first insulating layer 142 by introducing the insulating resin layer 141. When the first and second insulating layers 142 and 144 are PID, for example, the insulating resin layer 141 may include an organic insulating material such as photo-sensitive polyimide.

In a planar view, the redistribution layer 145 may redistribute a point connected to the contact pad 122 and an external circuit (e.g., a mainboard) to the contact region CA. The conductive post 150 may be disposed on the redistributed contact region CA.

As described above, the encapsulation layer 147 may be disposed on the second insulating layer 142 to surround the conductive post 150.

The conductive post 150 has a recessed surface RS positioned lower than an outer surface of the encapsulation layer 147 (also referred to as an "upper surface"). The encapsulation layer 147 has a through-hole connected to the contact region CA of the redistribution layer 145, and the conductive post 150 may be in a form filled in the through-hole.

The encapsulation layer 147 may be formed of various insulating materials. For example, the encapsulation layer 147 may include a thermosetting resin such as an epoxy resin and a thermoplastic resin such as polyimide. In some example embodiments, the encapsulation layer 147 may include Ajinomoto Build-up Film (ABF).

The conductive post 150 may include an intermetallic compound (IMC) layer 153 in contact with the conductive bump 160. The IMC layer 153 may be a compound metal obtained by reacting a material constituting the conductive bump 160 with a metal positioned on the conductive post 150. For example, when the conductive bump 160 is a solder ball, and an upper region of the conductive post 150 is copper, the IMC layer 153 may be a metal compound of a solder and copper. The IMC layer 153 may be a copper-rich IMC layer.

The IMC layer 153 may have an upper surface, lower than the upper surface of the encapsulation layer 147. For example, a difference (d) between levels of the upper surface of the IMC layer 153 and the upper surface of the encapsulation layer 147 may be at least 2 μm, and in some example embodiments, the difference (d) therebetween may be 3 μm or more.

As such, the IMC layer 153 may be surrounded by an encapsulation layer 147. Therefore, the IMC layer 153 has brittleness, and thus is vulnerable to thermal stress, but can be protected by the encapsulation layer 147 even in an environment exposed to thermal stress.

The conductive post 150 employed in the present example embodiment may serve as an underbump layer (UBM) to limit and/or prevent thermal stress generated from a joint portion to be connected to the main board from being transmitted to the semiconductor chip 120, and may be provided with a post structure having a constant height. For example, the thickness T of the conductive post 150 may be about 8 μm or more.

The conductive post 150 may include a first metal layer 151 sequentially disposed on the contact region CA, a second metal layer 153 having the IMC layer, and a conductive barrier film 152 disposed between the first and second metal layers 151 and 153.

For example, the first metal layer 151 may include a metal such as copper, and the conductive barrier film 152 may include at least one of Ni, Ti, and Ta. In the present example embodiment, the second metal layer 153 is an IMC layer reacted with the conductive bump 160, but may be the same metal (e.g., Cu) as the first metal layer 151 before forming the conductive bump 160.

The conductive barrier film 152 is disposed below the second metal layer 153 to define a maximum thickness of the IMC layer. That is, a thickness t2 of the second metal layer 153 may define the maximum thickness of the IMC layer. For example, the second metal layer 153 may range from 1 to 5 μm.

As such, the conductive barrier film 152 can limit and/or prevent formation of the IMC layer 153 having an excessive thickness. Although not limited thereto, in order to sufficiently secure the thickness T of the conductive post 150, a thickness t1 of the first metal layer 151 may be greater than the thickness t2 of the second metal layer 153.

The conductive bump 160 is used as an external connection terminal for physically and/or electrically connecting the semiconductor package 100 to an external device (e.g., a main board). The conductive bump 160 may be a conductive material, for example, a low melting point alloy such as Sn—Al—Cu. The conductive bump 160 may have a land or pin structure in addition to a ball such as a solder ball.

Figure 4:
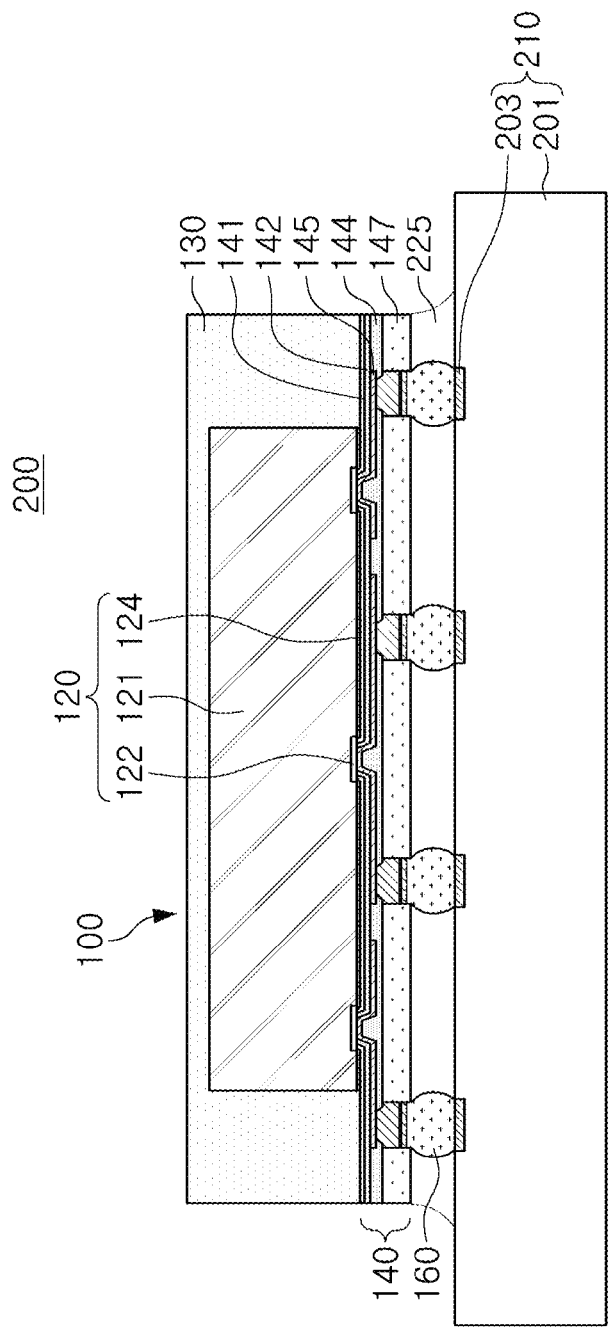
FIG. 4 is a cross-sectional view illustrating a main board on which the semiconductor package shown in FIG. 1 is mounted.

FIG. 4 is a cross-sectional view illustrating a main board on which the semiconductor package shown in FIG. 1 is mounted.

Referring to FIG. 4, a semiconductor package 100 disposed on a main board 200 such as a printed circuit board is illustrated. The semiconductor package may be the semiconductor package shown in FIG. 1.

The main board 200 may include a main body portion 201, a connection pad 203 disposed on an upper surface of the main body portion 201, and a wiring pattern (not shown) connected to the connection pad 201, and disposed on an upper surface of the main body portion 201 and/or disposed therein. The semiconductor package 100 is disposed on the upper surface of the main board 200, and the conductive bumps 160 may form a joint portion through a reflow process, together with the connection pad 203.

Even if stress due to a difference in a coefficient of thermal expansion (CTE) between a main constituent material of the semiconductor chip 120 (e.g., Si) and a major constituent material of the main board 200 (e.g., epoxy) is transferred to the joint portion (in particular, the IMC layer), the IMC layer 153, which is vulnerable to stress, can be protected by being surrounded by the encapsulation layer 160, thereby effectively limiting and/or preventing defects in the joint portion due to damages to the IMC layer 153.

FIGS. 5 to 13 are cross-sectional views of processes of a method of manufacturing a semiconductor package according to an example embodiment of inventive concepts. It can be understood that FIGS. 5 to 13 illustrate a portion illustrated in FIG. 3, that is, a region corresponding to "A1" of the semiconductor package illustrated in FIG. 1, respectively.

Figure 5:
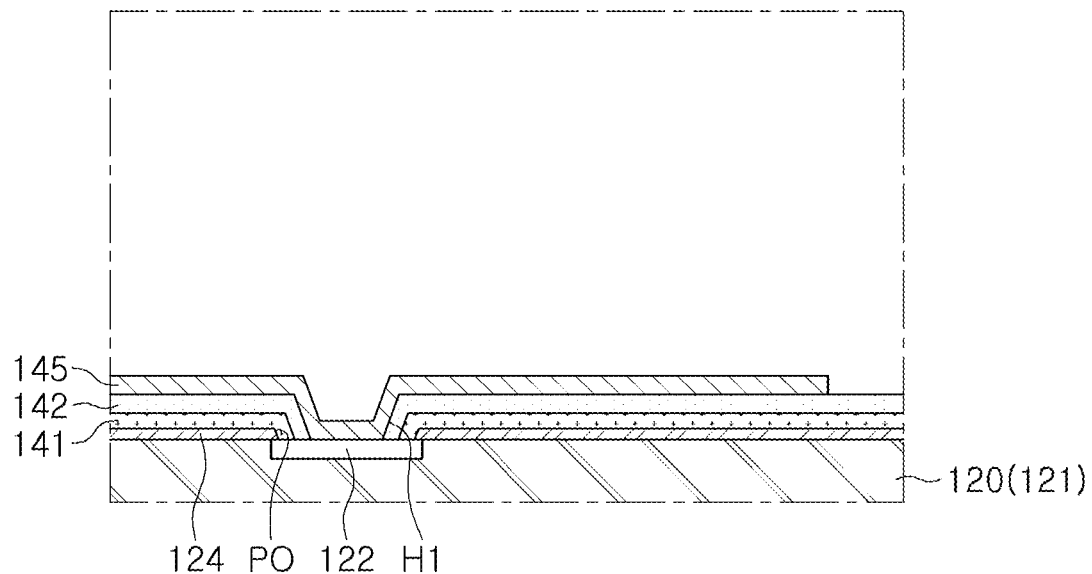
FIGS. 5 to 13 are cross-sectional views of processes of a method of manufacturing a semiconductor package according to an example embodiment of inventive concepts.
Figure 6:
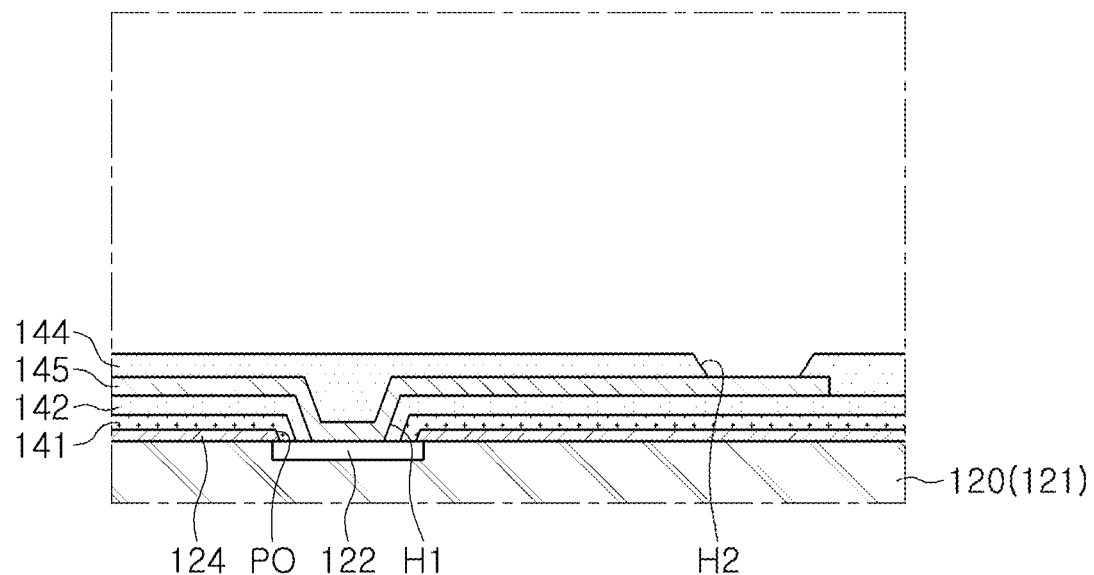

First, as shown in FIGS. 5 and 6, a redistribution structure 140 for rearranging the contact region CA on the active surface of the semiconductor chip 120 is formed.

Referring to FIG. 5, the semiconductor chip 100 includes a passivation film 124 with an opening exposing the contact pad 122. An insulating resin layer 141 and a first insulating layer 142 are sequentially formed on the active surface on which the passivation film 124 is formed. Subsequently, a first opening H1 is formed in the first insulating layer 142, and a redistribution layer 145 connected to the contact pad 122 is formed on the first insulating layer 142.

For example, the passivation film 124 may be a silicon oxide film or a silicon nitride film, and the first insulating layer 142 may be a photosensitive insulating material. The insulating resin layer may be provided for firm join between the passivation film 124 and the first insulating layer 142. The insulating resin layer 141 may also be photo-sensitive polyimide. As described above, when the insulating resin layer 141 and the first insulating layer 142 are formed of a photosensitive material, a process of forming the first opening H1 may be performed by a photoresist process.

Subsequently, referring to FIG. 6, a second insulating layer 144 is formed on the first insulating layer 142 to cover the redistribution layer 145, and a second opening H2 for opening the contact region CA of the redistribution layer 145 formed on the second insulating layer 144. The second insulating layer 144 may be the same as or a similar photosensitive insulating material to the first insulating layer 142. When the second insulating layer 144 is formed of a photosensitive material, a process of forming the second opening H2 may be performed by a photoresist process.

Figure 7:
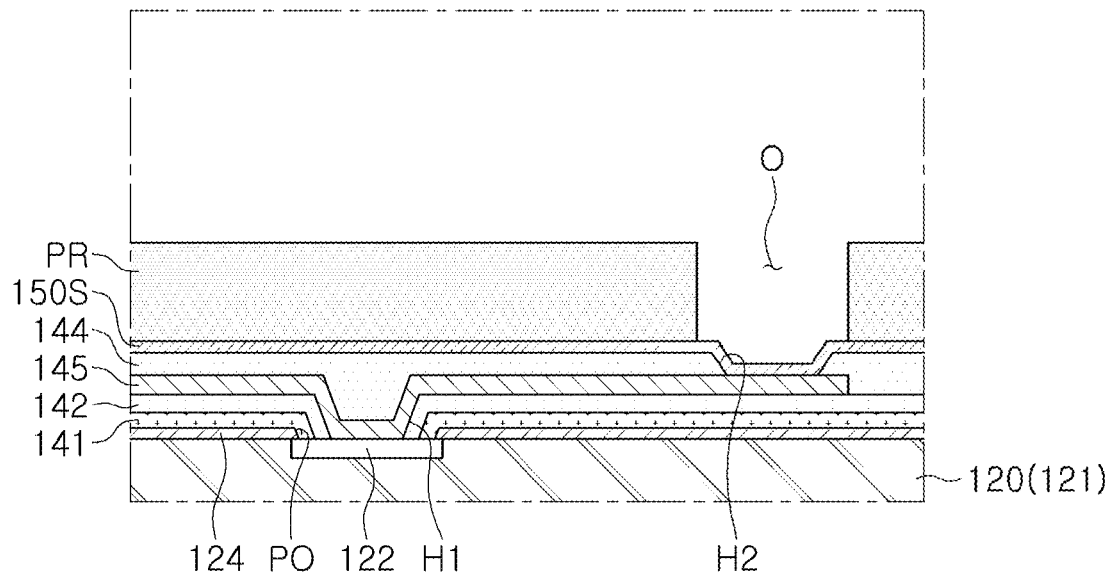

Next, referring to FIG. 7, a plating seed layer 150S is formed on an upper surface of the second insulating layer 144 to be connected to the contact region CA of the redistribution layer 145, and a photoresist PR having an opening O in which a region corresponding to the conductive post ("150" in FIG. 8) is opened is formed on the plating seed layer 150S. For example, the plating seed layer 150S may be Ti/W or Ti/Cu.

Figure 8:
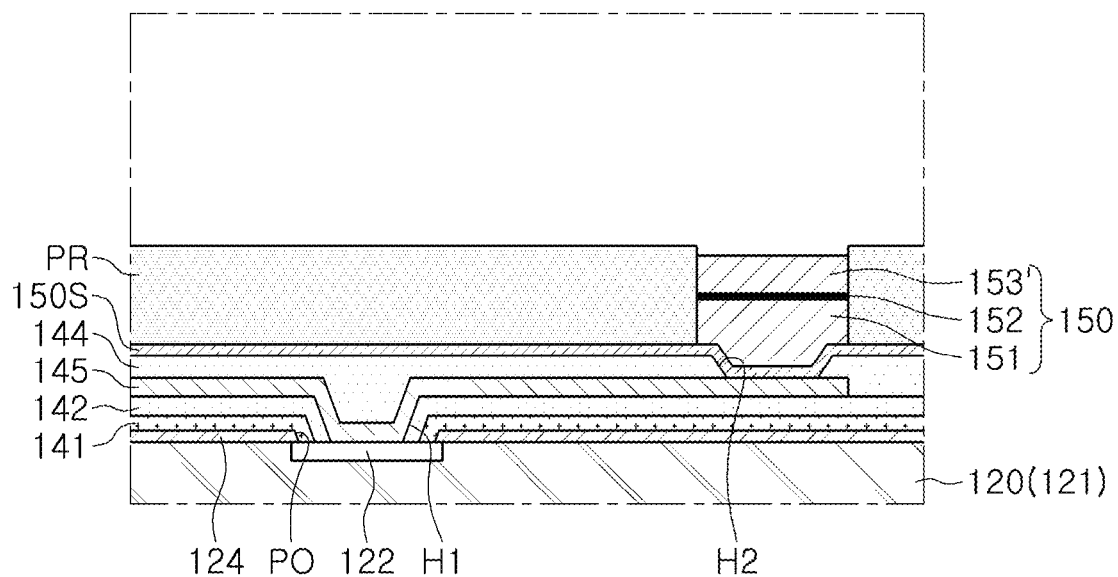

Subsequently, referring to FIG. 8, a conductive post 150 is formed in the opening O of the photoresist PR.

The conductive post 150 may plate the first metal layer 151 on a plating seed layer 150S exposed to the opening O, and then the conductive barrier film 152 and the second metal layer 153' can be plated sequentially. The first and second metal layers 151 and 153' may be metal plating layers such as Cu, and the conductive barrier film 152 may include at least one of Ni, Ti, and Ta.

The conductive post may be formed to have a constant height in order to limit and/or prevent thermal stress generated from a joint portion to be formed in a subsequent process from being transferred to the semiconductor chip 120. For example, the thickness T of the conductive post 150 may be about 8 μm or more. The conductive barrier film 152 may be introduced to limit and/or prevent formation of the IMC layer having an excessive thickness. The second metal layer 153 may have a thickness in a range of 1 to 5 μm or a slightly greater thickness (considering consumption during a grinding process). In some example embodiments, the first metal layer 151 may have a thickness greater than that of the second metal layer 153.

Figure 9:
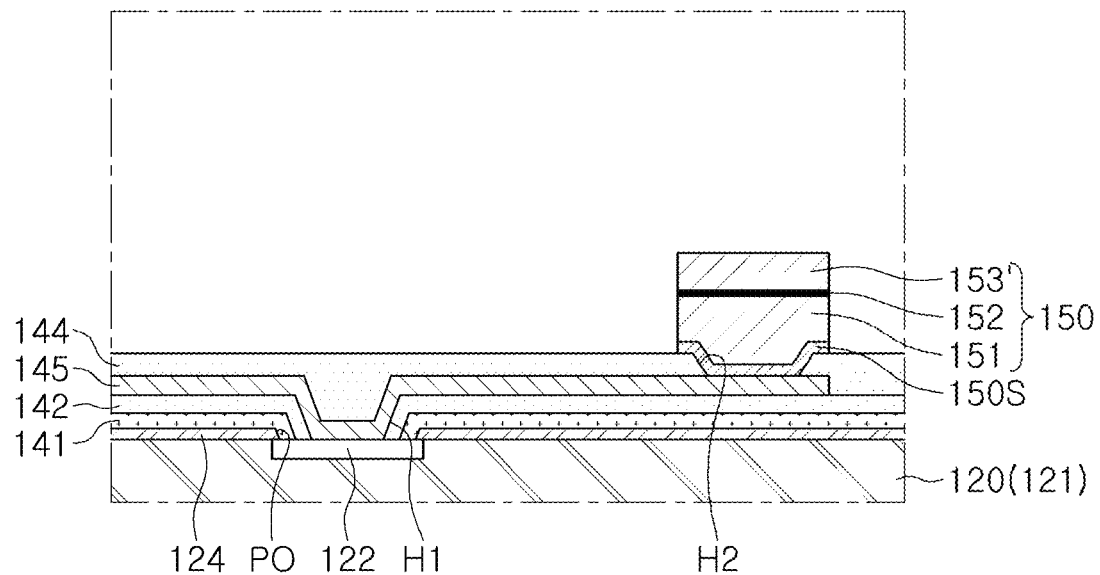

Next, referring to FIG. 9, a photoresist PR may be removed and a portion of the plating seed layer 150S exposed on the upper surface of the second insulating layer 144 may be removed.

In the present process, the photoresist PR may be removed by a lift-off process. For example, photoresist PR may be removed using a suitable process such as ashing, an etching process, or a combination thereof. Additionally, the plating seed layer 150S exposed through etching may be removed.

Next, an encapsulation layer 147 having an upper surface higher than the upper surface of the conductive post 150 may be formed while surrounding the conductive post 150. An example of the process of forming the encapsulation layer 147 may be described with reference to FIGS. 10 to 12.

Figure 10:
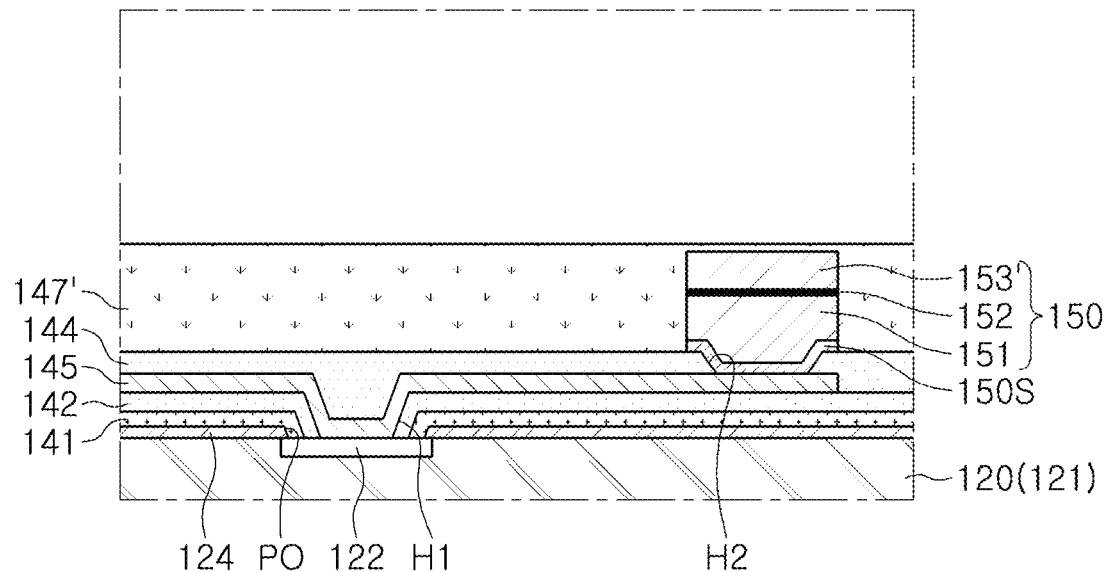

First, referring to FIG. 10, an encapsulation layer 147' covering the conductive post 150 may be formed on the upper surface of the second insulating layer 144.

The encapsulation layer 147' may be formed of various insulating materials. For example, the encapsulation layer 147' may include a thermosetting resin such as an epoxy resin and a thermoplastic resin such as polyimide. In some example embodiments, the encapsulation layer 147' may include an Ajinomoto Build-up Film (ABF).

Figure 11:
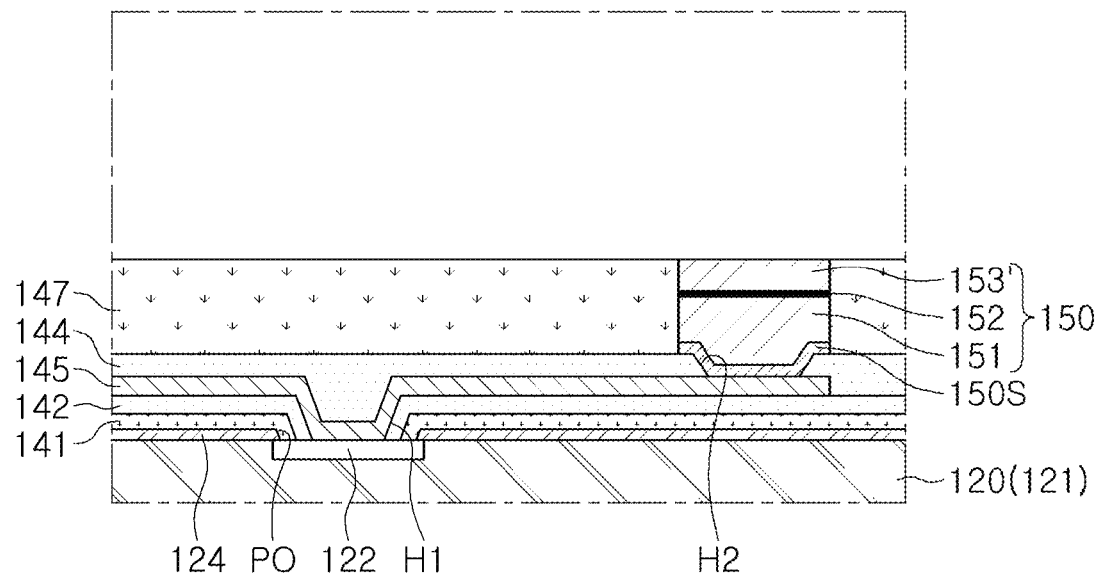

Subsequently, referring to FIG. 11, a grinding process may be applied to expose the upper surface of the conductive post 150 from the upper surface of the encapsulation layer 147.

By the present process, the upper surface of the conductive post 150 may be exposed, and the exposed upper surface of the conductive post 150 may be positioned on the same plane as the upper surface of the encapsulation layer 147.

Figure 12:
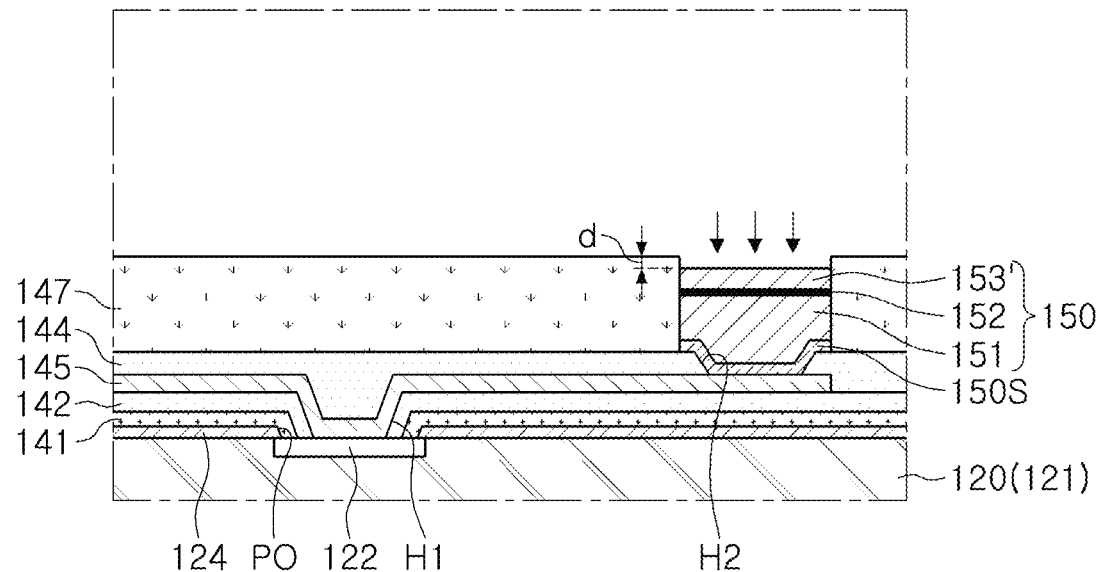

Next, referring to FIG. 12, a selective etching process may be performed so that the upper surface of the conductive post 150 is lower than the upper surface of the encapsulation layer 147.

In the present process, a height of a surface to be joined to the conductive bump (160 in FIG. 13) can be adjusted by using selective etching of the second metal layer 153' of the conductive post 150. Specifically, the upper surface of the second metal layer 153' bonded to the conductive bump (160 of FIG. 13) may be lower than the upper surface of the encapsulation layer 147'. The recessed upper surface of the conductive post, that is, the second metal layer 153', may be adjusted to be at least 2 μm lower than the upper surface of the encapsulation layer 147'.

Figure 13:
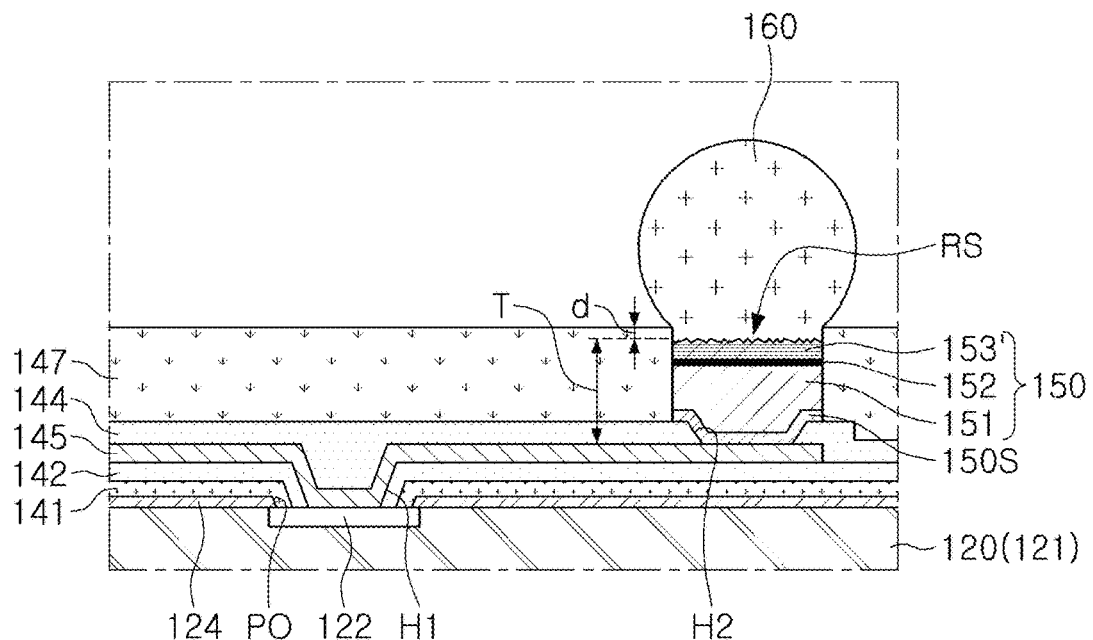

Subsequently, referring to FIG. 13, a conductive bump 160 is formed on the upper surface of the conductive post 150.

The conductive bump 160 may include an eutectic metal such as a solder. The eutectic metal may diffuse into the second metal layer 153' to form an IMC layer 153. That is, at least a portion of the second metal layer 153 ' may be formed as the IMC layer 153 from a surface that is bonded to the conductive bump 160. For example, when the second metal layer 153' is copper, the IMC layer 153 may be a copper-rich (Cu-rich) IMC layer. Since the IMC layer 153 has brittleness, and is vulnerable to mechanical impacts, but can be surrounded and protected by an encapsulation layer, reliability of the joint portion may be greatly improved.

The semiconductor package according to the present example embodiment may be implemented in various forms. For example, a redistribution structure 140 is illustrated as a single-level wiring layer 145, but in some example embodiments, the redistribution layer 140 may have a multiple-level redistribution layer. In other example embodiments, a conductive post may be placed directly on a contact pad without a redistribution layer and/or second insulation layer (see FIG. 16, where the second insulating layer may be omitted).

Figure 14:
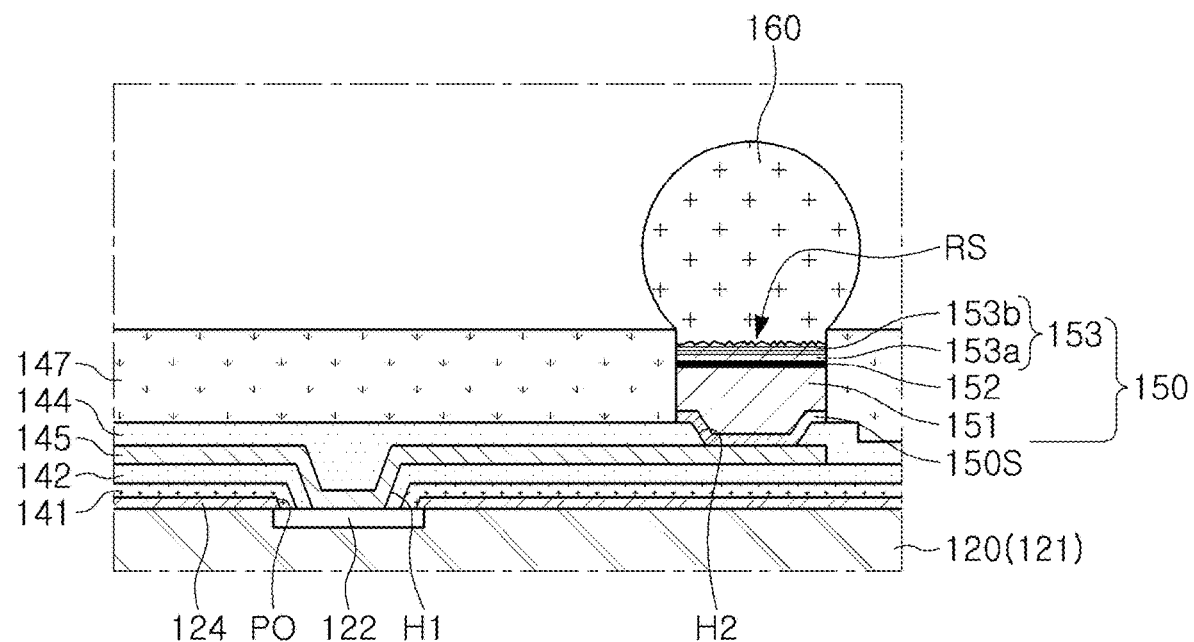
FIG. 14 is a partially enlarged view illustrating a semiconductor package according to an example embodiment of inventive concepts.

FIG. 14 is a partially enlarged view illustrating a semiconductor package according to an example embodiment of inventive concepts.

Referring to FIG. 14, it may be understood that a semiconductor package 100A according to the present example embodiment has a structure, similar to that of illustrated in FIGS. 1 to 3, except that the configuration of the second metal layer 153 of the conductive bump 150 is different. Descriptions of the components of the present example embodiment may refer to the description of the same or similar components of the semiconductor package 100 shown in FIGS. 1 to 3, unless specifically stated otherwise.

The conductive post 150 includes a first metal layer 151, a conductive barrier film 152 and a second metal layer 153 sequentially disposed on the contact region CA, similar to the previous example embodiment. In the present example embodiment, only an upper region, in contact with the conductive bump 160 of the second metal layer 153, may be provided as an IMC layer 153b. The conductive post 150 has an upper surface, lower than the upper surface of the encapsulation layer 147, similar to the previous example embodiment, and the IMC layer 153b may be surrounded by the encapsulation layer 147.

A remaining lower region of the second metal layer 153 may include a metal film 153a in which constituent elements of the conductive bump 160 are not substantially diffused. The metal film 153a may include the same metal material as the first metal layer 151. For example, the first metal layer 151 and the metal film 153 may include copper (Cu).

Figure 15:
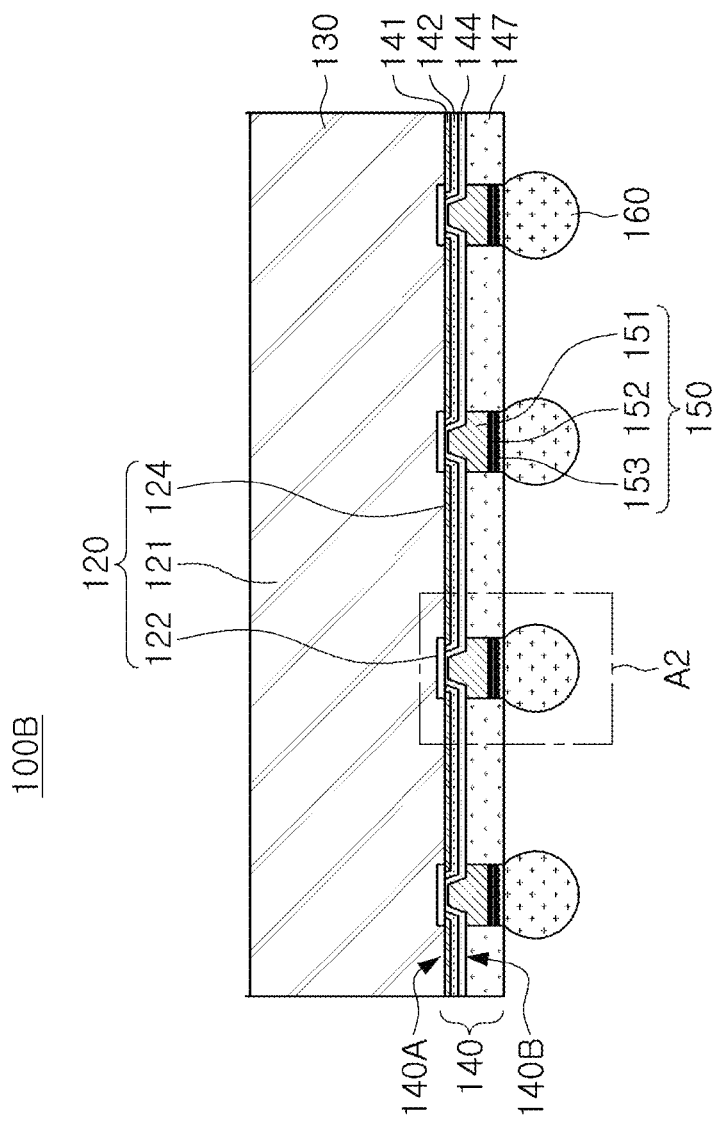
FIG. 15 is a side cross-sectional view illustrating a semiconductor package according to an example embodiment of inventive concepts.
Figure 16:
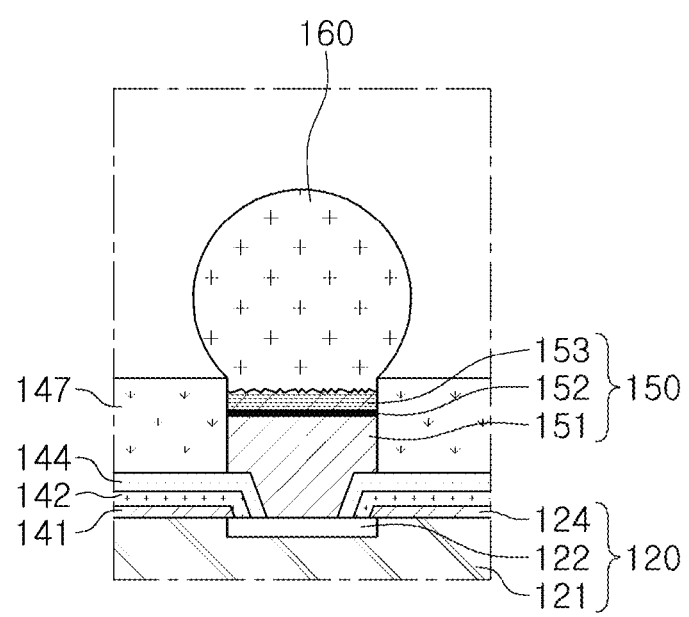
FIG. 16 is an enlarged view illustrating a region "A2" of the semiconductor package shown in FIG. 15.

FIG. 15 is a side cross-sectional view illustrating a semiconductor package according to an example embodiment of inventive concepts, and FIG. 16 is an enlarged view illustrating an area "A2" of the semiconductor package illustrated in FIG. 15.

Referring to FIGS. 15 and 16, it can be understood that a semiconductor package 100B according to the present embodiment has a structure similar to the structure shown in FIGS. 1 to 3, except that there is no redistribution layer. Description of the components of the present example embodiment may refer to the description of the same or similar components of the semiconductor package 100 shown in FIGS. 1 to 3, unless specifically stated otherwise.

A semiconductor package 100B may include according to the present example embodiment a semiconductor chip 120 having an active surface on which a contact pad 122 is disposed, an insulating layer 142 disposed on the active surface and having an opening for opening one region of the contact pad 122, an encapsulation layer 147 disposed on the insulating layer 142 and having a through-hole connected to the opening, a conductive post 150 filled in the through-hole and connected to the one region of the contact pad 122 through the opening, and a conductive bump 160 disposed on an upper surface of the conductive post 150.

The semiconductor chip 120 may include a passivation film 124 disposed on the active surface to open the contact pad 122. For example, the passivation film 124 may be a silicon oxide film or a silicon nitride film. An insulating resin layer 141 is disposed on the passivation film 124 to ensure firm join between the passivation film 124 and the first insulating layer 142. When the insulating layer 142 is PID, for example, the insulating resin layer 141 may include an organic insulating material such as photosensitive polyimide.

As shown in FIG. 16, a conductive post 150 according to the present example embodiment may be disposed on the contact pad 122 of the semiconductor chip 120 without a redistribution layer. The conductive post 150 may include a first metal layer 151 connected to the one region of the contact pad 122, a conductive barrier film 152 disposed on the first metal layer 151, and a second metal layer 153 disposed on the conductive barrier film 152. At least a region of the second metal layer 153 joined to the conductive bump 160 may include an IMC layer.

In the present example embodiment, almost all of the second metal layer 153 may include an IMC layer. The conductive post 150 may have an upper surface, lower than the upper surface of the encapsulation layer 147, and the IMC layer 153 may be surrounded by the encapsulation layer 147.

Figure 17:
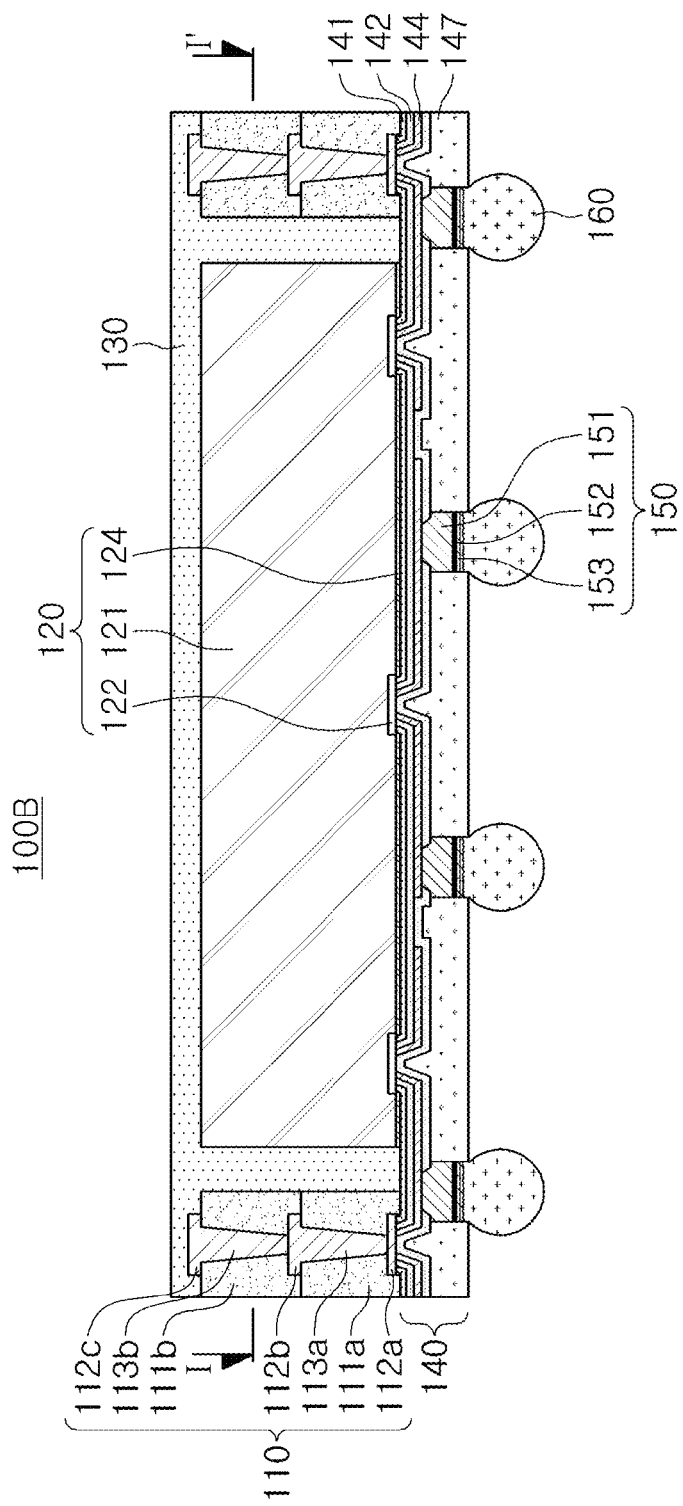
FIG. 17 is a side cross-sectional view illustrating a semiconductor package according to an example embodiment of inventive concepts.
Figure 18:
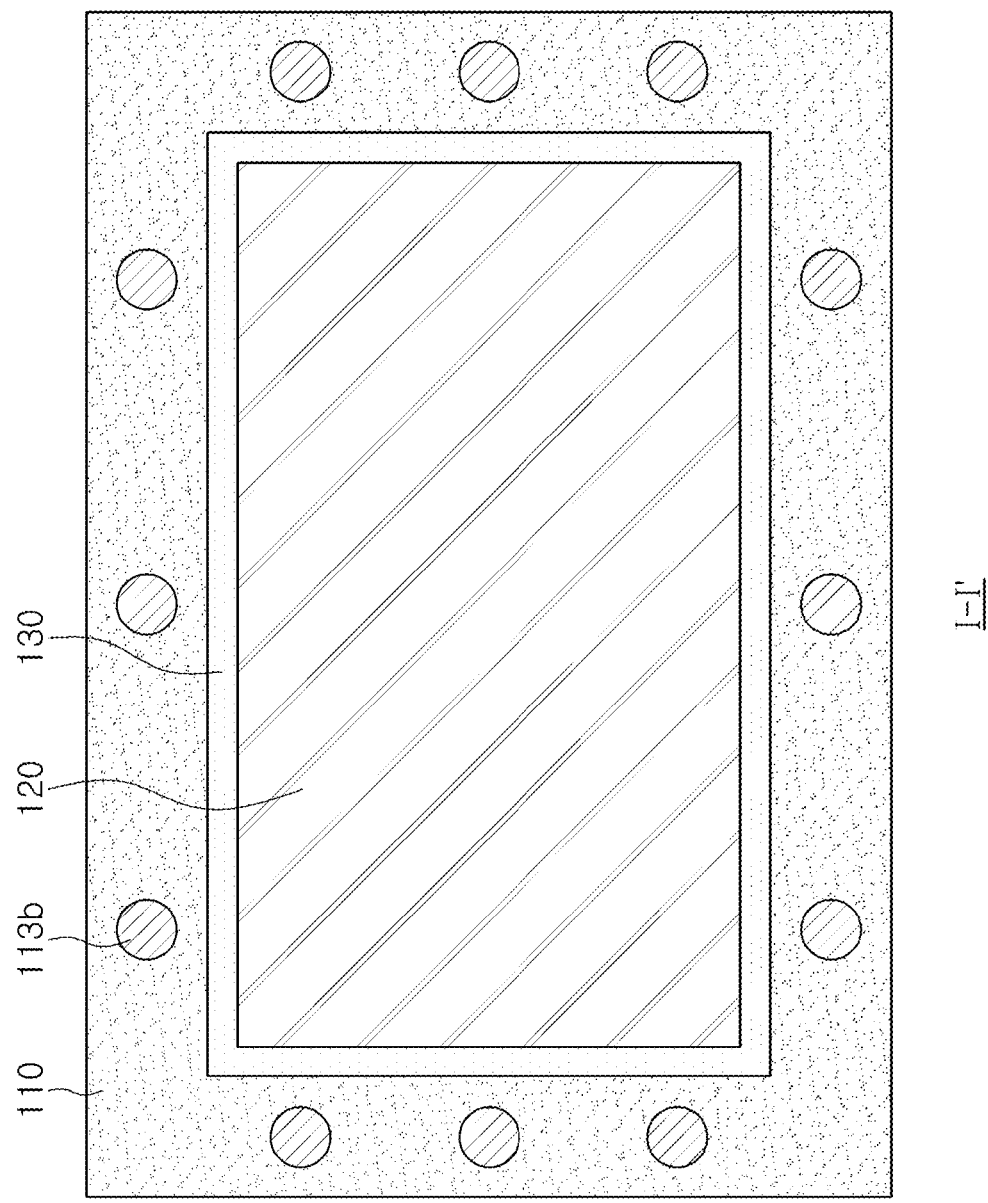
FIG. 18 is a cross-sectional view of the semiconductor package shown in FIG. 17 taken along line I-I'.

FIG. 17 is a side cross-sectional view illustrating a semiconductor package according to an example embodiment of the present disclosure, and FIG. 18 is a cross-sectional view of the semiconductor package shown in FIG. 17 taken along line I-I'.

Referring to FIGS. 17 and 18, it can be understood that a semiconductor package 100C according to the present example embodiment is similar to the structure illustrated in FIGS. 1 to 3 except that the frame 110 having a wiring structure is additionally introduced. Descriptions of the components of the present embodiment may refer to the description of the same or similar components of the semiconductor package 100 shown in FIGS. 1 to 3, unless specifically stated otherwise.

The semiconductor package 100C is disposed on the redistribution structure 140 and may include a frame 110 having a cavity 110H. The semiconductor chip 120 may be located in the cavity 110H of the frame 110. The frame 110 may further improve rigidity of the semiconductor package 100C.

The semiconductor package according to the previous example embodiment is a package manufactured in a wafer level process, whereas the semiconductor package according to the present example embodiment may be a package manufactured using a panel capable of simultaneously manufacturing a plurality (e.g., 4×4) packages (or a panel level package (PLP)).

The frame 110 is disposed on the redistribution structure 140 and may include a cavity 110H in which the semiconductor chip 120 is accommodated. The frame 110 includes a wiring structure connecting upper and lower surfaces.

The wiring structure employed in the present example embodiment may include first to third wiring layers 112a, 112b, and 112c and first and second wiring vias 113a, 113b connecting the first to third wiring layers 112a, 112b, and 112c, but is not limited thereto. In some example embodiments, it may be formed of different layers and structures. The wiring structure of the frame 110 (especially, the first wiring layer 112a)) may be connected to the redistribution layers 142 and 143 of the redistribution structure 140 to be electrically connected to the semiconductor chip 120.

Specifically, the frame 110 includes a first insulating layer 111a in contact with a redistribution substrate 140, a first wiring layer 112a in contact with the redistribution substrate 140 and embedded in the first insulating layer 111a, a second wiring layer 112b disposed on an opposite side of a side where the first wiring layer 112a of the first insulating layer 111a is embedded, a second insulating layer 111b disposed on the first insulating layer 111a and covering the second wiring layer 112b, and a third wiring layer 112c disposed on the second insulating layer 111b. First to third wiring layers 112a, 112b, and 112c are electrically connected to the connection pad 122. The first to third wiring layers 112a, 112b, and 112c are electrically connected to each other through first to second wiring vias 113a and 113b penetrating the first and second insulating layers 111a and 111b, respectively.

Since the frame 110 has a wiring structure connecting upper and lower surfaces as described above, a semiconductor package 100C may be used as a part (particularly, a lower package) of a Package on Package (POP) structure. In the present example embodiment, the molding portion 130 is extended to cover an upper surface of the frame 110, and may expose a portion of a wiring structure of the frame 110, that is, a portion of the third wiring layer 112c. A portion of the third wiring layer 112 exposed by the opening of the molding portion 130 may be provided with a pad region.

In some example embodiments, a semiconductor package 100C may further include additional redistribution layers disposed on the molding portion 130 and electrically connected to the wiring structure (particularly, the third wiring layer 112c) (see, 132 and 133 of FIG. 19) (or referred to as a "backside redistribution layer").

Figure 19:
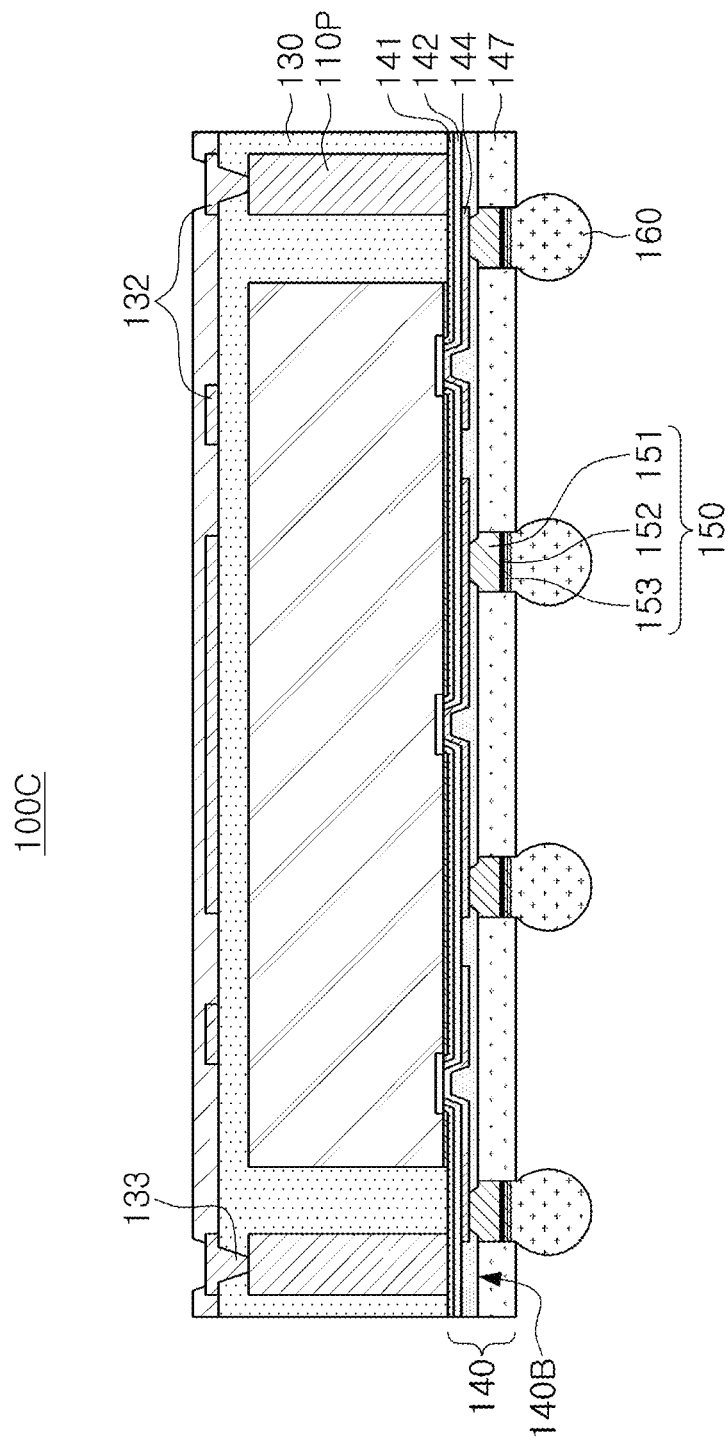
FIG. 19 is a side cross-sectional view illustrating a semiconductor package according to an example embodiment of inventive concepts.

FIG. 19 is a side cross-sectional view illustrating a semiconductor package 100D according to an example embodiment of inventive concepts.

Referring to FIG. 19, it can be understood that a semiconductor package 100D according to the present example embodiment has a structure, similar to the structure shown in FIGS. 1 to 3 except that the semiconductor package 100D has a vertical connection structure 110P connected to a redistribution layer and additional redistribution layers 132 and 133 connected to the vertical connection structure 110P. Description of the components of the present example embodiment may refer to the description of the same or similar components of the semiconductor package 100 shown in FIGS. 1 to 3, unless specifically stated otherwise.

The semiconductor package 100D according to the present example embodiment has a structure that can be utilized as a POP structure, similar to the embodiment shown in FIG. 17, but unlike the example embodiment shown in FIG. 17, it may be a wafer level package. In the semiconductor package 100D, an interconnection element connecting the backside redistribution layers 132 and 133 and the redistribution layer 145 of the redistribution structure 140 may be formed by using a vertical interconnection portion 110P such as a metal (e.g., copper) post, rather than a wiring structure of the frame (110 in FIG. 17).

The vertical interconnection portion 110P is disposed to penetrate a molding portion 130 sealing the semiconductor chip 120 to electrically connect the backside redistribution layers 132 and 133 and the redistribution layer 145 of the redistribution structure 140. The backside redistribution layers 132 and 133 may include a redistribution pattern 132 disposed on the molding portion 130 and a redistribution via 133 connecting the redistribution pattern 132 and the vertical interconnection portion 110P. In the present example embodiment, the vertical interconnection portion 110P is illustrated in a form being directly connected through the redistribution via 133, but is not limited thereto, and may be directly connected by the redistribution pattern 132 in other example embodiments.

In the example embodiments shown in FIGS. 17 and 18, the conductive post 150 may have a lower surface than the upper surface of the encapsulation layer 147. The conductive post 150 includes an IMC layer bonded to the conductive bump 160, and the IMC layer 153 may be surrounded by the encapsulation layer 147.

As set forth above, reliability of a joint portion may be increased by placing a conductive post on which conductive bumps such as solder balls are to be placed inside an encapsulation layer. Specifically, since the upper surface of the conductive post is further recessed than the upper surface of the encapsulation layer, it may be disposed on the recessed upper surface of the conductive bump, such as a solder ball, and the IMC layer formed by reacting through reflow may be located inside the encapsulation layer.

Therefore, since adhesive strength of the conductive bump can be maintained, it is possible to improve the reliability of the joint portion at a board level.

The various features, aspect, and effects of inventive concepts may be not limited to the above description, and may be more easily understood in the course of describing a specific embodiment of inventive concepts.

While example embodiments have been illustrated and described above, it will be apparent to those skilled in the art that modifications and variations could be made without departing from the scope of inventive concepts as defined by the appended claims.

What is claimed is:

1. A semiconductor package, comprising:
a semiconductor chip including an active surface and a contact pad on the active surface;
a first insulating layer on the active surface, the first insulating layer including a first opening that exposes the contact pad;
a redistribution layer connected to the contact pad, the redistribution layer extending to an upper surface of the first insulating layer;
a second insulating layer on the first insulating layer, the second insulating layer including a second opening that exposes a contact region of the redistribution layer;
a conductive post on the contact region, the conductive post including an intermetallic compound (IMC) layer, the IMC layer being spaced apart from the second insulating layer, an upper surface of the IMC layer being higher than an upper surface of the second insulating layer such that the upper surface of the IMC layer is farther from the active surface of the semiconductor chip compared to the upper surface of the second insulating layer;
an encapsulation layer on the second insulating layer, the encapsulation layer surrounding the conductive post, an upper surface of the encapsulation layer being higher than the upper surface of the IMC layer; and
a conductive bump on an upper surface of the conductive post, the conductive bump contacting the IMC layer, and an interface between the IMC layer and the conductive bump having an uneven surface.

2. The semiconductor package of claim 1, wherein
the conductive post comprises a first metal layer, a conductive barrier film, and a second metal layer sequentially disposed on the contact region, and
the second metal layer comprises the IMC layer.

3. The semiconductor package of claim 2, wherein the second metal layer comprises a metal film between the conductive barrier film and the IMC layer.

4. The semiconductor package of claim 3, wherein a metal material of the metal film of the second metal layer is the same as a metal material of the first metal layer.

5. The semiconductor package of claim 2, wherein a thickness of the first metal layer is greater than a thickness of the second metal layer.

6. The semiconductor package of claim 1, wherein the conductive post has a thickness of 8 μm or more.

7. The semiconductor package of claim 1, wherein the upper surface of the IMC layer is at least 2 μm lower than the upper surface of the encapsulation layer.

8. The semiconductor package of claim 1, wherein
the semiconductor chip includes a passivation film on the active surface.

9. The semiconductor package of claim 8, further comprising:
an insulating resin layer between the passivation film of the semiconductor chip and the first insulating layer.

10. The semiconductor package of claim 1, wherein at least one of the first insulating layer and the second insulating layer comprises a photosensitive insulating material.

11. A semiconductor package, comprising:
a redistribution structure including a first surface and a second surface opposing each other, the redistribution structure including a redistribution layer;
a semiconductor chip on the first surface of the redistribution structure, the semiconductor chip including an active surface and a contact pad, the active surface facing the first surface, the contact pad being on the first surface, the contact pad being connected to one region of the redistribution layer;
an encapsulation layer on the second surface of the redistribution structure, the encapsulation layer including a through-hole in which an other region of the redistribution layer is exposed, the encapsulation layer being spaced apart from the redistribution layer; and
a conductive post filling the through-hole of the encapsulation layer, the conductive post connected to the other region of the redistribution layer, the conductive post comprising an intermetallic compound (IMC) layer, the conductive post including an upper surface that is lower than an upper surface of the encapsulation layer, and the upper surface of the IMC layer having an uneven surface, and a lower surface of the conductive post being lower than a lower surface of a region of the encapsulation layer over a part of the redistribution structure between the contact pad and the conductive post such that the lower surface of the conductive post is closer to the second surface of the redistribution structure compared to the region of the encapsulation layer over the part of the redistribution structure between the contact pad and the conductive post.

12. The semiconductor package of claim 11, further comprising:
a conductive bump on the upper surface of the conductive post,
wherein the IMC layer of the conductive post is in contact with the conductive bump.

13. The semiconductor package of claim 12, wherein
the conductive post comprises a first metal layer connected to the other region of the redistribution layer, a conductive barrier film on the first metal layer, and a second metal layer on the conductive barrier film, and
the second metal layer including the IMC layer.

14. The semiconductor package of claim 13, wherein
the first metal layer and the second metal layer comprise Cu, and
the conductive barrier film comprises at least one of Ni, Ti and Ta.

15. The semiconductor package of claim 13, wherein the second metal layer has a thickness in a range of 1 to 5 μm.

16. The semiconductor package of claim 11, wherein
the conductive post has a thickness of 8 μm or more, and
the upper surface of the conductive post is at least 2 μm lower than the upper surface of the encapsulation layer.

17. The semiconductor package of claim 11, further comprising:
a molding portion, wherein
the semiconductor chip is on a portion of the first surface of the redistribution structure, wherein
the molding portion is on the first surface of the redistribution structure, and
the molding portion surrounds the semiconductor chip.

18. The semiconductor package of claim 11, wherein
the redistribution structure further comprises a first photosensitive insulating layer, and a second photosensitive insulating layer,
the first photosensitive insulating layer is on the active surface,
the first photosensitive insulating layer including a first opening that exposes a region of the contact pad,
the redistribution layer is connected to the region of the contact pad and extends to an upper surface of the first photosensitive insulating layer, and
the second photosensitive insulating layer is on the first photosensitive insulating layer and includes a second opening exposing the other region of the redistribution layer.

19. A semiconductor package, comprising:
a semiconductor chip including an active surface, a contact pad on the active surface, and a passivation film on the active surface, the passivation film including a pad opening that exposes the contact pad;
an insulating layer on the passivation film, the insulating layer including an opening that exposes a region of the contact pad;
an encapsulation layer on the insulating layer, the encapsulation layer including a through-hole over the opening;
a conductive post filling the through-hole, the conductive post connected to the region of the contact pad through the opening, the conductive post comprising an intermetallic compound (IMC) layer, an upper surface of the IMC layer being lower than an upper surface of the encapsulation layer and having an uneven surface, a lower surface of the conductive post being lower than a lower surface of a region of the encapsulation layer between the opening and the conductive post such that a first vertical distance between the active surface of the semiconductor chip and the conductive post is less than a second vertical distance between the active surface of the semiconductor chip and the region of the encapsulation layer; and
a conductive bump on an upper surface of the conductive post, the conductive bump contacting the IMC layer.

20. The semiconductor package of claim 19, wherein
the conductive post comprises a first metal layer, a conductive barrier film, and a second metal layer,
the first metal layer is connected to the region of the contact pad,
the conductive barrier film is on the first metal layer, and
the second metal layer is on the conductive barrier film and includes the IMC layer.

* * * * *